United States Patent [19]
Miyake et al.

[11] Patent Number: 6,054,713
[45] Date of Patent: Apr. 25, 2000

[54] ELECTRON BEAM EXPOSURE APPARATUS

[75] Inventors: Akira Miyake, Utsunomiya; Masato Muraki, Inagi; Masahiko Okunuki, Akiruno; Shigeru Terashima, Utsunomiya; Shin Matsui, Urawa, all of Japan

[73] Assignee: Canon Kabushiki Kaisha, Tokyo, Japan

[21] Appl. No.: 09/013,304

[22] Filed: Jan. 26, 1998

[30] Foreign Application Priority Data

Jan. 29, 1997 [JP] Japan .................................. 9-015266

[51] Int. Cl.$^7$ .................................................. H01J 37/30
[52] U.S. Cl. ...................................... 250/492.24; 250/398
[58] Field of Search ........................... 250/492.2, 492.24, 250/398

[56] References Cited

U.S. PATENT DOCUMENTS

| | | | |
|---|---|---|---|
| 4,705,956 | 11/1987 | Ward | 250/492.24 |
| 4,789,786 | 12/1988 | Yasuda | 250/492.24 |
| 4,974,919 | 12/1990 | Muraki et al. | 350/6.6 |
| 5,023,462 | 6/1991 | Yamada et al. | 250/492.24 |
| 5,153,773 | 10/1992 | Muraki et al. | 359/619 |
| 5,157,700 | 10/1992 | Kurosawa et al. | 378/34 |
| 5,345,292 | 9/1994 | Shiozawa et al. | 355/67 |
| 5,363,170 | 11/1994 | Muraki | 355/67 |
| 5,777,747 | 7/1998 | Tanaka | 250/548 |

FOREIGN PATENT DOCUMENTS

| | | | |
|---|---|---|---|
| 143326 | 8/1984 | Japan | 250/492.24 |

Primary Examiner—Bruce C. Anderson
Attorney, Agent, or Firm—Fitzpatrick, Cella, Harper & Scinto

[57] ABSTRACT

An electron beam exposure apparatus, which illuminates a mask with light emitted by a light source, photoelectrically converts the light patterned by the mask using a photoelectric converter, and exposes an object to be exposed with a patterned electron beam emitted by the photoelectric converter. The apparatus includes an electron optical system for imaging the electron beam emitted by the photoelectric converter onto the object, an axial shifter for shifting an optical center of the electron optical system in a direction perpendicular to an optical axis, an axial deflector for deflecting the electron beam that propagates in the electron optical system, a region limiter for limiting a region of the mask to be projected onto the object via the photoelectric converter and the electron optical system to a partial region of the mask, and a scan controller for scanning the object with the region-limited electron beam by changing the partial region to be limited while controlling the axial shifter and axial deflector.

10 Claims, 11 Drawing Sheets

ELECTRON BEAM EXPOSURE APPARATUS

BACKGROUND OF THE INVENTION

The present invention relates to an electron beam exposure apparatus and, more particularly, to an electron beam exposure apparatus which illuminates a mask with light emitted by a light source, photoelectrically converts the light patterned by the mask using a photoelectric converter, and exposes the object to be exposed using the patterned electron beam coming from the photoelectric converter.

Conventionally, optical steppers with high productivity are used in the mass-production process in the manufacture of semiconductor memory devices. However, in the manufacture of memory devices such as 1G or 4G DRAMs which have a line width of 0.2 µm or less, electron beam exposure with high resolution and productivity has gained widespread appeal as one of exposure techniques that replace optical exposure.

Since conventional electron beam exposure normally uses a single beam Gaussian method and a variable forming method and has a low productivity, it is used in only applications that can make use of the feature of high resolution performance of an electron beam such as mask drawing, research and development of VLSIs, and exposure for ASIC devices to be manufactured in small quantities.

As described above, how to improve the productivity is the bottleneck to mass-production of exposure in an electron beam exposure apparatus. As a method of removing such a bottleneck, the following method has been proposed. In this method, a light beam is shaped into a predetermined pattern via a mask, and the patterned light beam is irradiated onto a photoelectric converter. An electron beam having a predetermined pattern and coming from the photoelectric converter is accelerated and converged, and is projected onto a wafer.

An example of a conventional electron beam exposure apparatus that realizes this method will be described below with reference to FIG. 12. This electron beam exposure apparatus 1 comprises, as an ultraviolet light source 2, a mercury lamp for emitting ultraviolet rays as a light beam. A collimator lens 3 and the like are inserted on the optical axis of the ultraviolet light source 2 to form an illumination optical system 4 there. A field angle limit aperture stop 5 for limiting the range of transmitted light, an ultraviolet mask 6 for shaping the transmitted light into a predetermined pattern, an ultraviolet projection optical system 7 for converging the patterned ultraviolet rays, a vacuum window 8, a photoelectric converter 9 located on the optical image plane of the convergent ultraviolet rays, and the like are disposed in turn along the optical axis of the illumination optical system 4. Since the photoelectric converter 9 emits electrons upon irradiation of ultraviolet rays, an acceleration electrode 10 for accelerating electrons, an electron projection optical system 11 for converging the electrons, a wafer 1000 located on the optical image plane of the convergent electrons, and the like are disposed in turn along the optical axis of the electrons emitted.

The wafer 1000 is held on a wafer stage 13 via a chuck 12, and the wafer stage 13 moves the wafer 1000 in two-dimensional directions perpendicular to the optical axis, which directions agree with back-and-forth and right-and-left directions in FIG. 1. The ultraviolet mask 6 is supported by a mask stage 14, which similarly moves the ultraviolet mask 6 in the two-dimensional directions perpendicular to the optical axis.

The vacuum window 8 consists of quartz glass, and is fitted in a vacuum chamber 15, and members below the photoelectric converter 9 are disposed inside the vacuum chamber 15. The ultraviolet projection optical system 7 is made up of a pair of optical lenses 16 and 17, aperture stop 18, and the like, and the electron projection optical system 11 is made up of a pair of electron lenses 19 and 20, correction coil 21, electron beam aperture stop 22, and the like. The electron lenses 19 and 20, and correction coil 21 comprise electromagnetic coils, and electromagnetically control an electron beam. An electron beam intensity detector 23 comprising, e.g., a Faraday cup or the like is arranged beside the wafer stage 13, and a secondary electron detector 24 is arranged at a position opposing the wafer 1000 from obliquely above.

The ultraviolet mask 6 shields transmitted light in accordance with a pattern formed of a chromium film on a quartz substrate, and is similar to that used in conventional photolithography. The pattern is formed in correspondence with the projection magnification of the electron beam exposure apparatus 1. For example, when the projection magnification of the ultraviolet projection optical system 7 and the like is 1×, and that of the electron projection optical system 11 is ¼×, since the projection magnification of the electron beam exposure apparatus 1 is ¼×, the pattern to be transferred onto the wafer 1000 is formed on the ultraviolet mask 6 in a 4× enlarged scale.

The photoelectric converter 9 is prepared by forming an anti-charging transparent conductor film of, e.g., ITO (indium-tin oxide) on the surface of a quartz substrate having a thickness of several mm, and forming a photoelectric conversion substance of, e.g., CsI (cesium iodide) having a small work function. The converter 9 emits electrons at a density proportional to the incident light intensity. A power supply circuit (not shown) is connected to the transparent conductor film, and a voltage of, e.g., −30 kV with respect to a lens barrel is applied to the film. The acceleration electrode 10 is formed into a net pattern, and is applied with a voltage having the same potential as the lens barrel. For example, the electrode 10 accelerates electrons emitted by the photoelectric converter 9 to 30 keV.

The electron beam exposure apparatus 1 with the above-mentioned structure can form the pattern of the ultraviolet mask 6 on the wafer 1000 by exposure. More specifically, the range of ultraviolet rays coming from the illumination optical system 4 as a collimated light beam is limited by the field angle limit aperture stop 5, and the limited ultraviolet rays are incident on the ultraviolet mask 6. The ultraviolet rays are shaped into a predetermined pattern by the ultraviolet mask 6, and the patterned ultraviolet rays form an image on the photoelectric converter 9 via the ultraviolet projection optical system 7. The photoelectric converter 9 converts the incoming ultraviolet rays into an electron beam, and the electron beam is accelerated by the acceleration electrode 10. The electron beam then forms an image on the wafer 1000 via the electron projection optical system 11.

At this time, when the optical projection magnification is set at 1× and the electrooptical projection magnification is set at ¼×, as described above, since the total projection magnification is ¼×, the pattern on the ultraviolet mask 6 is reduced to ¼, and forms an image on the wafer 1000, thus forming a micropattern. In particular, since an electron beam can realize finer exposure than ultraviolet rays, if the projection magnification of the electron beam is set to be smaller than that of the optical system, the pattern on the ultraviolet mask 6 can be satisfactorily reduced and formed on the wafer 1000 by exposure.

When the pattern on the ultraviolet mask 6 is formed on the wafer 1000 by exposure, as described above, since aberrations such as curvature of field and the like of the electron projection optical system 11 are produced, it is difficult to simultaneously form the entire pattern on the ultraviolet mask 6 onto the wafer 1000 by exposure. For example, when a micropattern as small as about 0.1 μm is to be transferred, the region that can be transferred in one exposure is limited to that having a diameter of about 0.5 mm around the optical axis.

To solve this problem, in the above-mentioned electron beam exposure apparatus 1, the incident region of ultraviolet rays onto the ultraviolet mask 6 is limited by the field angle limit aperture stop 5, and the ultraviolet mask 6 and wafer 1000 are synchronously scanned and moved in the two-dimensional direction by the corresponding stages 14 and 13, thereby sequentially forming the entire pattern on the ultraviolet mask 6 onto the entire region of the wafer 1000.

In the above-mentioned electron beam exposure apparatus 1, by sequentially moving the region to be transferred from the ultraviolet mask 6 onto the wafer 1000 by exposure, the entire pattern on the ultraviolet mask 6 can be transferred onto the wafer 1000 by exposure at high resolution.

However, since only a portion of the ultraviolet mask 6 can be transferred onto the wafer 1000 by exposure at a time, several tens of reciprocal scans are required to transfer the entire pattern on the ultraviolet mask 6 onto the wafer 1000. As such scan movements are mechanically done by the stages 13 and 14, and high-speed operation is hard to attain, the conventional electron beam exposure apparatus 1 has a low productivity of exposure.

SUMMARY OF THE INVENTION

The present invention has been made in consideration of the above situation, and has as its object to provide an electron beam exposure apparatus with high productivity.

An electron beam exposure apparatus according to the present invention illuminates a mask with light emitted by a light source, photoelectrically converts the light patterned by the mask using a photoelectric converter, and exposes an object to be exposed with a patterned electron beam emitted by the photoelectric converter, comprising: an electron optical system for imaging the electron beam emitted by the photoelectric converter onto the object to be exposed; an axial shifter for shifting an optical center of the electron optical system in a direction perpendicular to an optical axis; an axial deflector for deflecting the electron beam that propagates in the electron optical system; region limit means for limiting a pattern on the mask to be projected onto the object to be exposed to a partial region; and scan control means for controlling the axial shifter and axial deflector to scan the object to be exposed with the region-limited electron beam.

In a preferred embodiment, the scan control means controls the axial shifter and axial deflector to operate in synchronism with each other.

In a preferred embodiment, the scan control means scans the region-limited electron beam in a main scan direction by controlling the axial shifter and axial deflector, and the electron beam exposure apparatus further comprises second scan control means for controlling driving of a stage for supporting the mask and/or a stage for supporting the object to be exposed so as to scan the object to be exposed with the region-limited electron-beam in a subscan direction.

In a preferred embodiment, the region limit means comprises: an aperture stop located between the light source and the mask; and an aperture drive unit for scanning the aperture stop in a direction agreeing with a direction to scan the electron beam by the axial shifter and axial deflector.

In a preferred embodiment, the region limit means comprises an aperture unit located between the light source and the mask, the aperture unit comprises: a stationary aperture stop having a slit-like aperture elongated in a direction agreeing with a direction to scan the electron beam by the axial shifter and axial deflector; a rotary aperture stop having a slit-like aperture elongated in a radial direction thereof; and a drive unit for rotating the rotary aperture stop, and the rotary aperture stop is disposed at a position where a direction pointing from a center of the rotary aperture stop to the aperture of the stationary aperture stop is perpendicular to the direction to scan the electron beam by the axial shifter and axial deflector.

In a preferred embodiment, the region limit means comprises: a mirror for reflecting light emitted by the light source and illuminating the mask with the reflected light; an aperture stop inserted between the light source and the mirror; and a mirror drive unit for driving the mirror to scan the light reflected by the mirror in a direction agreeing with a direction to scan the electron beam by the axial shifter and axial deflector.

In a preferred embodiment, the region limit means comprises an aperture stop permanently disposed in a path of the electron beam in the electron optical system.

A preferred embodiment further comprises a focus adjustment unit for adjusting a focal point position of the electron optical system in synchronism with the control of the axial shifter and axial deflector by the scan control means.

An electron beam exposure apparatus according to a preferred embodiment of the present invention comprises an illumination optical system for outputting a light beam, a mask for shaping the light beam coming from the illumination optical system into a predetermined pattern, a mask stage for supporting the mask to be movable in a direction perpendicular to the optical axis, a photoelectric converter for converting the light beam patterned by the mask into an electron beam, a wafer stage for supporting a wafer to be movable in a direction perpendicular to the optical axis of the electron beam, an electron projection optical system for imaging the patterned electron beam emitted by the photoelectric converter onto the surface of the wafer, an axial shifter for shifting the optical center of the electron projection optical system in a direction perpendicular to the optical axis, an axial deflector for deflecting the path of the electron beam in the electron projection optical system, region limit means for limiting the pattern of the mask to be transferred onto the wafer by exposure to a partial region, main scan control means for main-scanning partially limited exposure regions of the mask and wafer by synchronizing operations of the axial shifter and axial deflector, and subscan control means for sub-scanning the mask and wafer by synchronizing operations of the mask stage and wafer stage to the operation of the main scan control means.

According to the electron beam exposure apparatus, the light beam coming from the illumination optical system is shaped into a predetermined pattern, and the patterned light beam is converted into an electron beam by the photoelectric converter. The patterned electron beam is imaged on the wafer surface via the electron projection optical system. The pattern on the mask to be transferred onto the wafer by exposure is limited to a partial region by the region limit means. At this time, since the optical center of the electron projection optical system is shifted in the direction perpendicular to the optical axis and the path of the electron beam in the electron projection optical system is shifted by the axial shifter and axial deflector which are synchronously operated by the main scan control means, the partially limited exposure regions of the mask and wafer are main-scanned. Furthermore, since the operations of the mask stage and wafer stage are synchronized with the above-mentioned main scan operation by the subscan control means, the mask and wafer are subscanned in synchronism with the main scan of the exposure regions, thus transferring the entire region on the mask onto the wafer by exposure. At this time, since subscan movement that can be done at low speed is mechanically executed but the high-speed main scan is electromagnetically executed and does not require any mechanical operation, broad-range exposure can be executed at high speed. In the electromagnetic main scan, since the path of the electron beam in the electron projection optical system is deflected, and the optical center of the electron projection optical system is shifted, the electron beam can be imaged at high precision while being main-scanned.

An electron beam exposure apparatus according to another embodiment of the present invention comprises an illumination optical system for outputting a light beam, a mask for shaping the light beam coming from the illumination optical system into a predetermined pattern, a mask stage for supporting the mask to be movable in a direction perpendicular to the optical axis, a photoelectric converter for converting the patterned light beam into an electron beam, a wafer stage for supporting a wafer to be movable in a direction perpendicular to the optical axis of the electron beam, an electron projection optical system for imaging the patterned electron beam onto the surface of the wafer, an axial shifter for shifting the optical center of the electron projection optical system in a direction perpendicular to the optical axis, an axial deflector for deflecting the path of the electron beam in the electron projection optical system, region limit means for limiting the pattern of the mask to be transferred onto the wafer by exposure to a partial region, subscan control means for subscanning the mask and wafer by synchronizing operations of the mask stage and wafer stage, and main scan control means for main-scanning partially limited exposure regions of the mask and wafer by synchronizing operations of the axial shifter and axial deflector with the operation of the subscan control means.

According to the electron beam exposure apparatus, the light beam coming from the illumination optical system is shaped into a predetermined pattern, and the patterned light beam is converted into an electron beam by the photoelectric converter. The patterned electron beam is imaged on the wafer surface via the electron projection optical system. The pattern on the mask to be transferred onto the wafer by exposure is limited to a partial region by the region limit means. At this time, since the subscan control means synchronizes the operations of the mask stage and wafer stage, the mask and wafer are subscanned with respect to the exposure position. Furthermore, since the main scan control means synchronizes the operations of the axial shifter and axial deflector with the above-mentioned subscan operation, the optical center of the electron projection optical system is shifted in the direction perpendicular to the optical axis, and the path of the electron beam in the electron projection optical system is deflected. For this reason, the partially limited exposure regions of the mask and wafer are main-scanned and subscanned, and the entire region on the mask is transferred onto the wafer by exposure. Since subscan movement that can be done at low speed is mechanically executed but the high-speed main scan is electromagnetically executed and does not require any mechanical operation, broad-range exposure can be executed at high speed. In the electromagnetic main scan, since the path of the electron beam in the electron projection optical system is deflected, and the optical center of the electron projection optical system is shifted, the electron beam can be imaged at high precision while being main-scanned.

According to still another embodiment, in the above electron beam exposure apparatus, the region limit means preferably comprises an aperture stop which is supported in an incident optical path of the photoelectric converter to be movable in the direction perpendicular to the optical axis, and region scan means for main-scanning the aperture stop in synchronism with the operation of the main scan control means.

In this case, since the light beam which is limited by the aperture stop and then enters the photoelectric converter is main-scanned by the region scan means in synchronism with the operation of the main scan control means, the exposure regions of the mask and wafer are main-scanned, and the main-scanned electron beam is satisfactorily imaged on the wafer surface.

According to still another embodiment, in the above electron beam exposure apparatus, the region limit means preferably comprises an aperture stop for limiting a light beam coming from the illumination optical system, and deflection scan means for main-scanning the limited light beam in synchronism with the operation of the main scan control means.

In this case, since the light beam coming from the illumination optical system is limited by the aperture stop and is then main-scanned by the deflection scan means in synchronism with the operation of the main scan control means, the exposure regions of the mask and wafer are main-scanned, and the main-scanned electron beam is satisfactorily imaged on the wafer surface.

According to still another embodiment, in the above electron beam exposure apparatus, the region limit means preferably comprises an aperture stop which is permanently disposed in a beam path of the electron projection optical system.

In this case, since the electron beam is limited by the aperture stop disposed in the electron projection optical system, when this electron beam is deflected and scanned by the axial deflector and axial shifter, the exposure regions of the mask and wafer are main-scanned.

The above electron beam exposure apparatus preferably comprises focus correction means for moving the focal point position of the electron beam in the optical axis direction in correspondence with the operation of the main scan control means.

In this case, since the focus correction means moves the focal point position of the electron beam in correspondence with the operation of the main scan control means, the focal point position that varies due to deflection and scan of the electron beam by the axial deflector and axial shifter is corrected onto the wafer surface.

Further objects, features and advantages of the present invention will become apparent from the following detailed description of embodiments of the present invention with reference to the accompanying drawings.

DETAILED DESCRIPTION OF THE PREFERRED EMBODIMENTS

Figure 1:
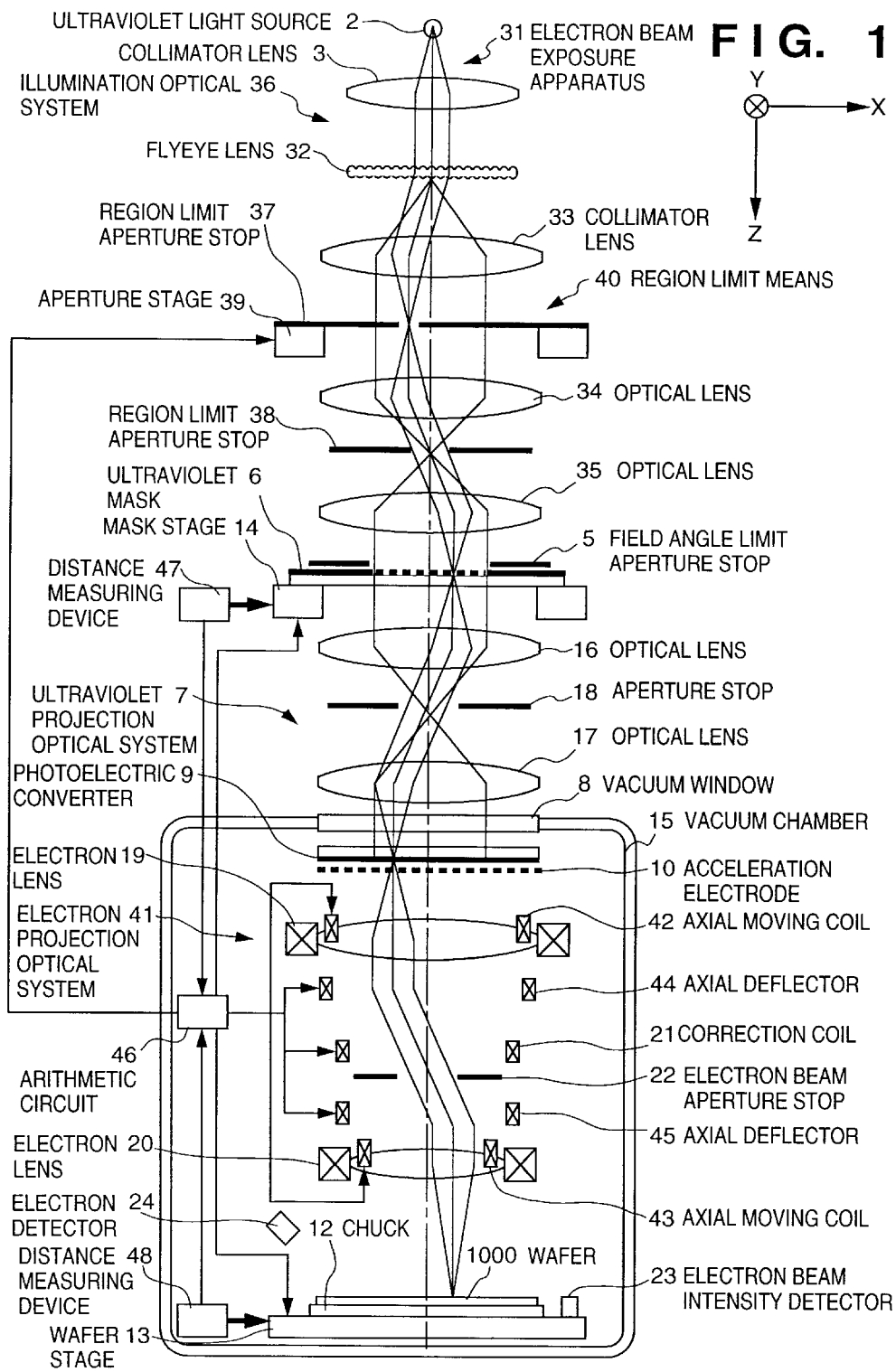
FIG. 1 is a front longitudinal sectional view showing the structure of an electron beam exposure apparatus according to the first embodiment of the present invention.

The first embodiment of the present invention will be described hereinafter with reference to FIGS. 1 to 5. Note that the same reference numerals in an electron beam exposure apparatus of this embodiment denote the same parts as those in the conventional electron beam exposure apparatus 1 described above, and a detailed description thereof will be omitted.

Figure 2:
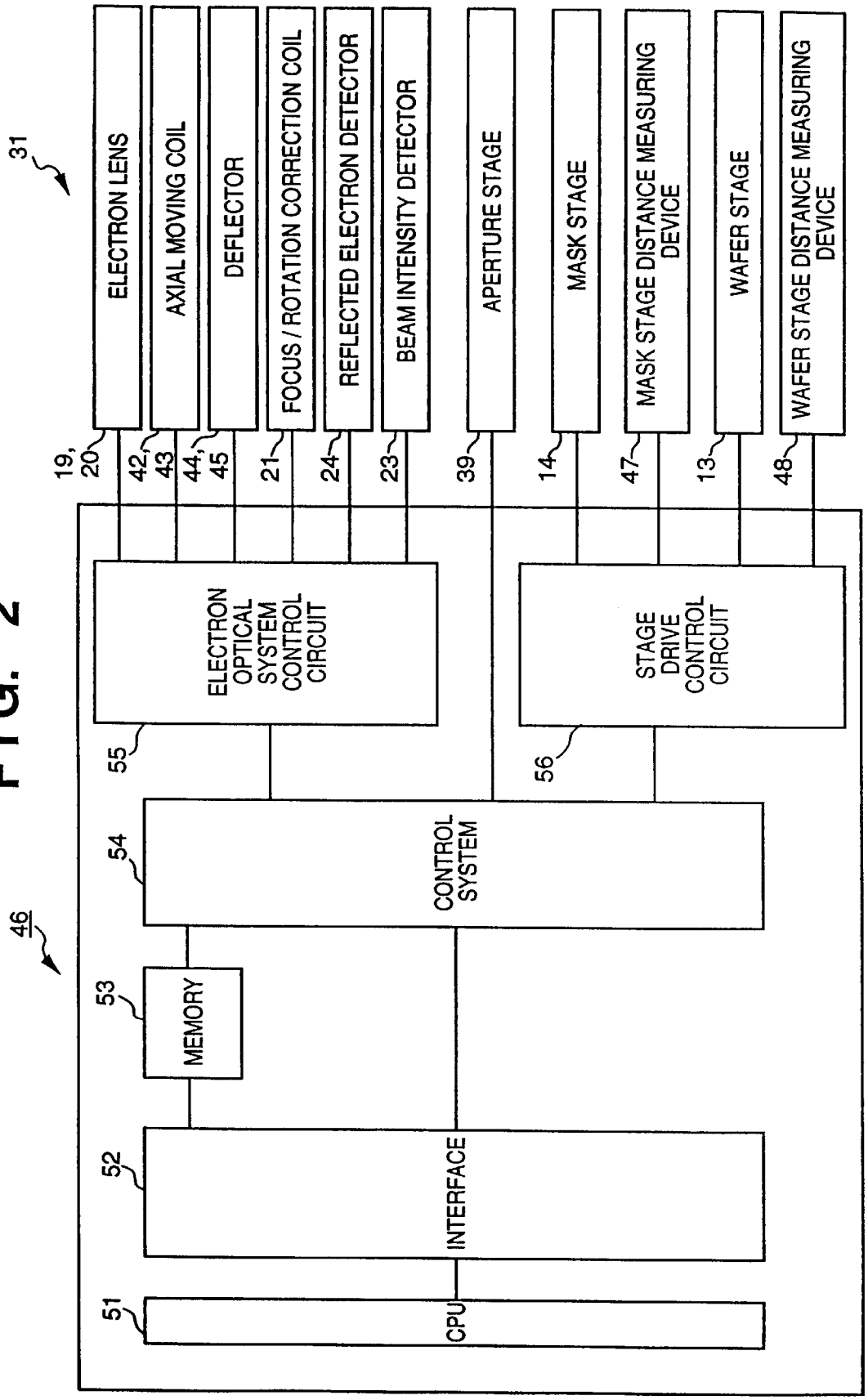
FIG. 2 is a block diagram showing the electrical structure of the electron beam exposure apparatus.
Figure 3:
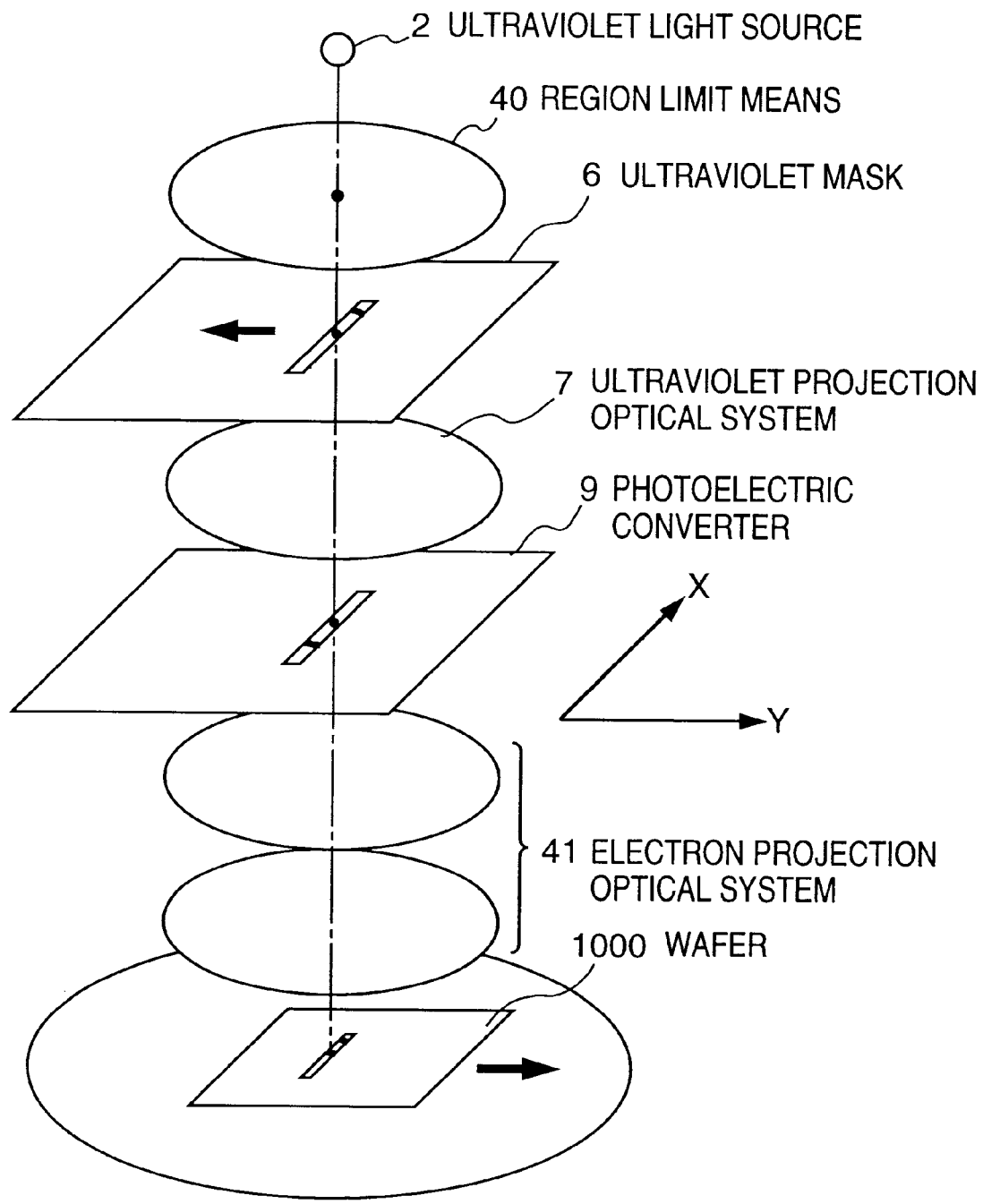
FIG. 3 is an exploded perspective view showing the principle of main scan and subscan.
Figure 4A:
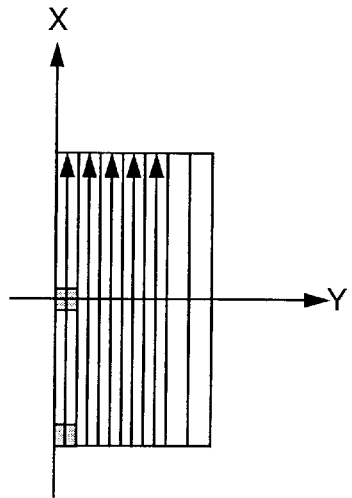
FIGS. 4A and 4B are plan views showing the main-scan and subscan operations.
Figure 4B:
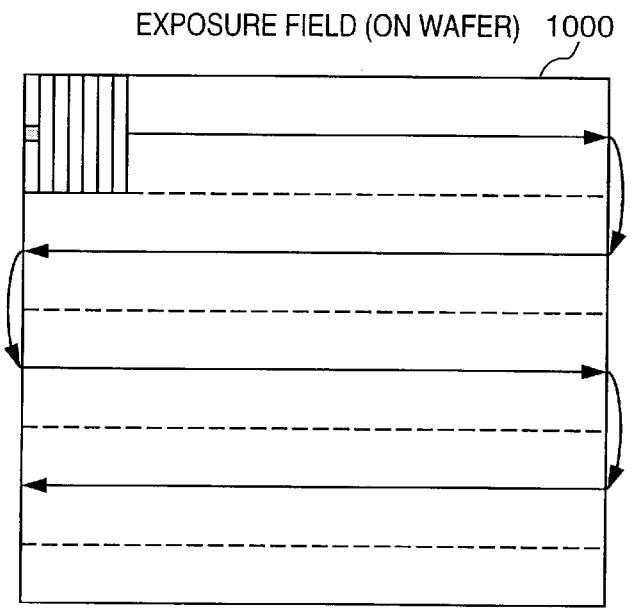
Figure 5:
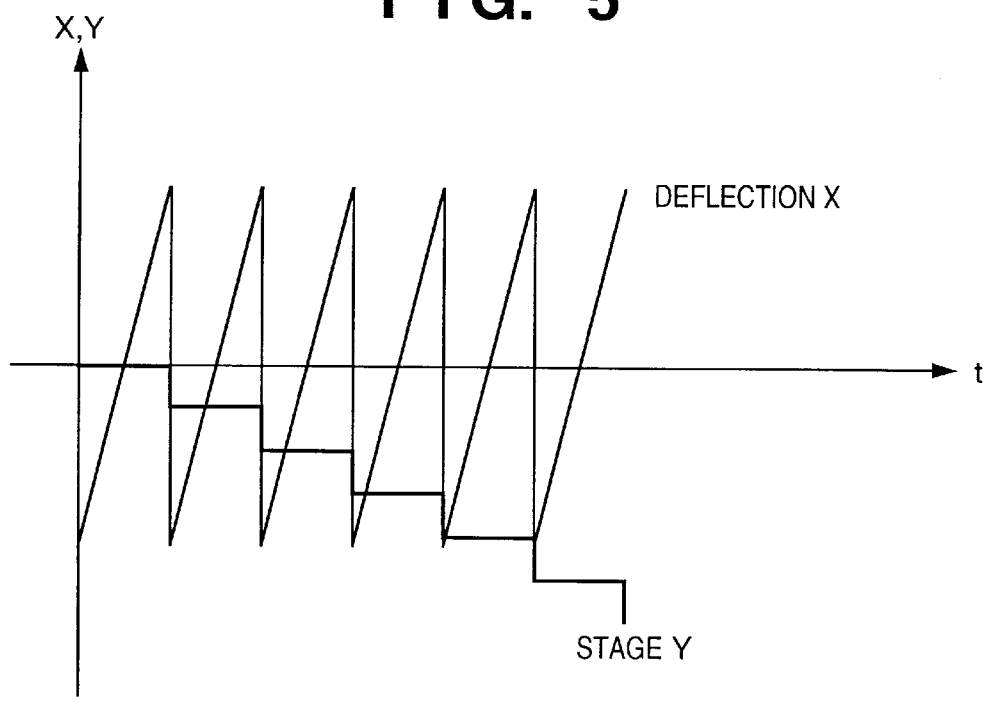
FIG. 5 is a timing chart showing the relationship between the main scan and subscan.

FIG. 1 is a front longitudinal sectional view showing the optical structure of an electron beam exposure apparatus according to this embodiment, FIG. 2 is a block diagram showing the electrical structure of the electron beam exposure apparatus, FIG. 3 is an exploded perspective view showing the relative relationship among the individual portions in exposure scan, and FIGS. 4A and 4B are plan views showing the exposure scan procedure, and FIG. 5 is a timing chart showing exposure scan control. In the following description as well as the drawings, the main scan direction will be referred to as an X-direction, and the subscan direction will be referred to as a Y-direction. For example, in FIG. 1, the right-and-left direction in FIG. 1 agrees with the X-direction, and the direction perpendicular to the plane of the drawing agrees with the Y-direction.

An electron beam exposure apparatus 31 of this embodiment also comprises, as an ultraviolet light source 2, a mercury lamp for emitting ultraviolet rays as a light beam. A collimator lens 3, flyeye lens 32, collimator 33, optical lenses 34 and 35, and the like are disposed in turn along the optical axis of the ultraviolet light source 2 to form an illumination optical system 36. Region limit aperture stops 37 and 38 for limiting a light beam are disposed on the optical path inside the illumination optical system 36, and one of these aperture stops is supported by an aperture stage 39 serving as a region scan means to be movable in the X-direction perpendicular to the optical axis, thus forming a region limit means 40.

More specifically, in this embodiment, the projection magnification of the illumination optical system 36 is 2×, and the region limit aperture stop 37 is formed to limit ultraviolet rays to be transmitted to a 2 mm square region. Since the aperture stage 39 reciprocally moves the region limit aperture stop 37 at ±8-mm intervals in the Y-direction, the ultraviolet mask 6 is scanned with the ultraviolet rays in a 4 mm square region at ±16-mm intervals in the Y-direction.

A field angle limit aperture stop 5, ultraviolet mask 6, ultraviolet projection optical system 7, vacuum window 8, photoelectric converter 9, and the like are disposed in turn along the optical axis of the illumination optical system 36, and an acceleration electrode 10, electron projection optical system 41, wafer 1000, and the like are disposed in turn along the optical axis of an electron beam emitted by the photoelectric converter 9.

The electron projection optical system 41 comprises a pair of axial moving coils 42 and 43 disposed at the positions of a pair of electron lenses 19 and 20 and serving as an axial shifter, and a pair of axial deflectors 44 and 45 disposed between these axial moving coils 42 and 43, in addition to the electron lenses 19 and 20, correction coil 21, electron beam aperture stop 22, and the like. The axial moving coils 42 and 43 electromagnetically move the optical centers of the electron lenses 19 and 20 by a maximum of ±4 mm in the X-direction perpendicular to the optical axis, and the axial deflectors 44 and 45 electromagnetically deflect the optical path of the electron beam between the electron lenses 19 and 20 by a maximum of ±4 mm in the X-direction.

These axial moving coils 42 and 43, axial deflectors 44 and 45, and correction coil 21 are connected to an arithmetic circuit 46 which individually controls their operations. To this arithmetic circuit 46, stages 13, 14, and 39, and distance measuring devices 47 and 48 for respectively measuring the positions of the stages 13 and 14 are connected. As shown in FIG. 2, the arithmetic circuit 46 comprises a one-chip CPU 51, I/F 52, memory 53, control circuits 54 to 56 in units of systems, and the like, and can serve as, e.g., main scan control means and subscan control means since it executes various processing operations in accordance with predetermined proper programs.

More specifically, when the pattern on the ultraviolet mask 6 is to be transferred onto the wafer 1000 by exposure, partially limited exposure regions of the ultraviolet mask 6 and wafer 1000 are main-scanned in the X-direction by synchronizing the operation of the aperture stage 39 with those of the axial moving coils 42 and 43 and axial deflectors 44 and 45, as shown in FIGS. 4A and 4B. Furthermore, as shown in FIGS. 3 to 5, the ultraviolet mask 6 and wafer 1000 are moved stepwise in the Y-direction by synchronizing the operations of the mask stage 14 and wafer stage 13 with that main scan operation, thus subscanning the main-scanned exposure regions.

At this time, the arithmetic circuit 46 directly detects the moving positions of the mask stage 14 and wafer stage 13 using the distance measuring devices 47 and 48, and feeds back the detection results to accurately control the subscan positions of the ultraviolet mask 6 and wafer 1000. Also, the arithmetic circuit 46 controls the operation of the correction coil 21 in synchronism with the above-mentioned main scan operation, thereby forming a focal point of the electron beam on the surface of the wafer 1000 as a focus correction means.

In the above-mentioned arrangement, the electron beam exposure apparatus 31 of this embodiment transfers the pattern on the ultraviolet mask 6 onto the wafer 1000 by exposure. More specifically, ultraviolet rays coming from the illumination optical system 36 as a collimated light beam Köhler-illuminate the ultraviolet mask 6 after their region is limited by the field angle limit aperture stop 5, and are shaped by the ultraviolet mask 6 into a predetermined pattern. The patterned ultraviolet rays are imaged on the photoelectric converter 9 by the ultraviolet projection optical system 7. The ultraviolet rays are converted by the photoelectric converter 9 into an electron beam, which is imaged on the wafer 1000 by the electron projection optical system 41.

At this time, in the electron beam exposure apparatus 31 of this embodiment, the exposure regions of the ultraviolet mask 6 and wafer 1000 are main-scanned in the X-direction by synchronously operating the region limit aperture stop 37, axial moving coils 42 and 43, and axial deflectors 44 and 45, and the exposure position main-scanned in the X-direction is subscanned in the Y-direction by subscanning the ultraviolet mask 6 and wafer 1000 in the Y-direction in synchronism with the main scan.

As described earlier, since aberrations such as curvature of field and the like are produced in the electron projection optical system 41, it is hard to broaden the region for one exposure. For example, when a micropattern having a line width as small as about 0.1 $\mu$m is to be transferred by exposure, a region for one exposure is limited to that having a diameter of about 0.5 mm around the optical axis. For this reason, the electron beam exposure apparatus 31 of this embodiment limits the exposure region to a small one, electromagnetically main-scans it at high speed, and mechanically subscans this main-scan position.

More specifically, as shown in FIG. 1, when the aperture stage 39 controlled by the arithmetic circuit 46 main-scans the region limit aperture stop 37 in the X-direction, the region irradiated with ultraviolet rays of the ultraviolet mask 6 is limited to a given range, and is main-scanned in the X-direction. With this main scan, since an electron beam emitted by the photoelectric converter 9 is also main-scanned in the X-direction while its region is limited, the arithmetic circuit 46 controls the axial moving coil 42 in synchronism with the electron beam so as to electromagnetically main-scan the optical center of the electron lens 19 in the X-direction. When the arithmetic circuit 46 controls the axial deflectors 44 and 43 in synchronism with the main scan of the optical center, the path of the electron beam between the electron lenses 19 and 20 is deflected in the X-direction. Also, when the arithmetic circuit 46 controls the axial moving coil 43 in synchronism with this deflection, the optical center of the electron lens 20 is also main-scanned in the X-direction. Furthermore, when the arithmetic circuit 46 controls the correction coil 21 in synchronism with the above-mentioned main scan, the electron beam can be accurately imaged on the surface of the wafer 1000.

The moving amounts of the axial moving coils 42 and 43, and axial deflectors 44 and 45 are set on the basis of the projection magnifications of the projection optical systems 7 and 41 for the ultraviolet rays and electron beam. More specifically, when the magnification of the ultraviolet projection optical system 7 that projects the pattern on the ultraviolet mask 6 onto the photoelectric converter 9 is M1, and that of the electron projection optical system 41 that images the electron beam coming from the photoelectric converter 9 on the surface of the wafer 1000 is M2, if a1 represents the moving amount of the first axial moving coil 42, a2 that of the second axial moving coil 43, d1 the deflection amount of the first axial deflector 44, and d2 that of the second axial deflector 45, they need only satisfy:

a1=d1, a2=d2=M2×a1.

In this case, an electron beam emitted from a position separated by a1 from the geometric center of the photoelectric converter 9 passes through the optical centers of the first and second electron lenses 19 and 20, and is imaged on the surface of the wafer 1000 at a position separated by M2×a1 from the position of the column geometric center. More specifically, the arithmetic circuit 46 controls the drive currents of the axial moving coils 42 and 43, and axial deflectors 44 and 45 to satisfy the above-mentioned condition.

In the above-mentioned case, since an image M1×M2 times that on the ultraviolet mask 6 is projected onto the wafer 1000, if M1=1 and M2=¼, a 0.4-$\mu$m pattern on the ultraviolet mask 6 is projected onto the photoelectric converter 9 as a 0.4-$\mu$m pattern, and that pattern is projected onto the wafer 1000 as a 0.1-$\mu$m pattern. If the maximum value of the moving amount a1 of the first axial moving coil 42 is 10 mm, the exposure region on the wafer 1000 is main-scanned by a maximum range of ±2.5 mm.

For example, when a 4 mm square region having X=4 mm as the center on the ultraviolet mask 6 is illuminated, a pattern is projected onto a 4 mm square region having X=−4 mm as the center on the photoelectric converter 9 to emit photons. At this time, the optical center of the front electron lens 19 is controlled to the position of X=−4 mm by the axial moving coil 42. The electron beam that has passed through the optical center of the electron lens 19 in that state is deflected to a position of X=+1 mm by the pair of axial deflectors 44 and 45. The electron beam passes through the optical center of the electron lens 20 which has been moved to the position of the X=+1 mm by the rear axial moving coil 43, and is imaged on the wafer 1000 at a position of X=+1 mm while being converged to 1 mm square by the electron lenses 19 and 20.

In this way, as shown in FIGS. 3 to 5, the ultraviolet rays projected onto the ultraviolet mask 6 are main-scanned while their region is limited, and are converted into a region-limited electron beam to be main-scanned onto the wafer 1000. Hence, a predetermined main-scan region on the ultraviolet mask 6 is transferred onto the wafer 1000 by exposure. Upon completion of such a main scan for one line, the mask stage 14 and wafer stage 13 controlled by the arithmetic circuit 46 subscan the ultraviolet mask 6 and wafer 1000 in the Y-direction.

For example, when a range of Y=4 mm on the ultraviolet mask 6 is transferred onto a range of Y=1 mm on the wafer 1000 by exposure in one main scan, as described above, the mask stage 14 executes a subscan of Y=4 mm every time the main scan for exposure is completed, and the wafer stage 13 executes a subscan of Y=1 mm every time the main scan for exposure is completed. With these subscans, since the main-scan positions of exposure on the ultraviolet mask 6 and wafer 1000 are subscanned, a broad range on the ultraviolet mask 6 is transferred onto the wafer 1000 by exposure by repeating these operations.

In the electron beam exposure apparatus 31 of this embodiment, since the mask stage 14 and wafer stage 13 move the ultraviolet mask 6 and wafer 1000 in the two-dimensional directions, as shown in FIG. 4B, a stripe-shaped region exposed by the above-mentioned main scan and subscan is also sequentially moved in the main scan direction. For example, when the width, in the main scan direction, of a semiconductor chip to be manufactured on the wafer 1000 is X=36 mm, and a stripe-shaped region having a width X=9 mm in the main scan direction on the wafer 1000 is exposed by the above-mentioned main scan and subscan, the ultraviolet mask 6 is moved by X=36 mm in the subscan direction, and the wafer 1000 is moved by X=9 mm in the subscan direction every time exposure for that stripe-shaped region is completed. By repeating such movements four times, the entire region on the ultraviolet mask 6 is transferred onto the wafer 1000 by exposure.

In the electron beam exposure apparatus 31 of this embodiment, since the main scan and subscan are combined, as described above, a pattern in a broad range on the ultraviolet mask 6 can be transferred onto the wafer 1000 by exposure, and the subscans of the ultraviolet mask 6 and wafer 1000 that can be done at low speed are mechanically executed but the main scan can be done at high speed since it is electromagnetically executed by the axial moving coils 42 and 43, and axial deflectors 44 and 45. For this reason, the electron beam exposure apparatus 31 of this embodiment can quickly execute exposure and can improve the productivity of exposure.

In addition, when the main scan for exposure is electromagnetically executed, as described above, since the optical centers of the electron lenses 19 and 20 are moved by the axial moving coils 42 and 43 in synchronism with deflection of the path of the electron beam by means of the axial deflectors 44 and 45, the electron beam is always converged at the optical centers of the electron lenses 19 and 20, and aberrations can be prevented from being produced, thus accurately executing exposure. Furthermore, since the correction coil 21 corrects the focal point position of the electron beam, exposure can be done more accurately.

Moreover, since the ultraviolet rays to be projected onto the ultraviolet mask 6 are limited by the region limit aperture stop 37 and the limited ultraviolet rays are main-scanned, unwanted ultraviolet rays can be prevented from being irradiated onto the ultraviolet mask 6 and production of stray light can be effectively prevented, thus executing exposure more satisfactorily.

Figure 6:
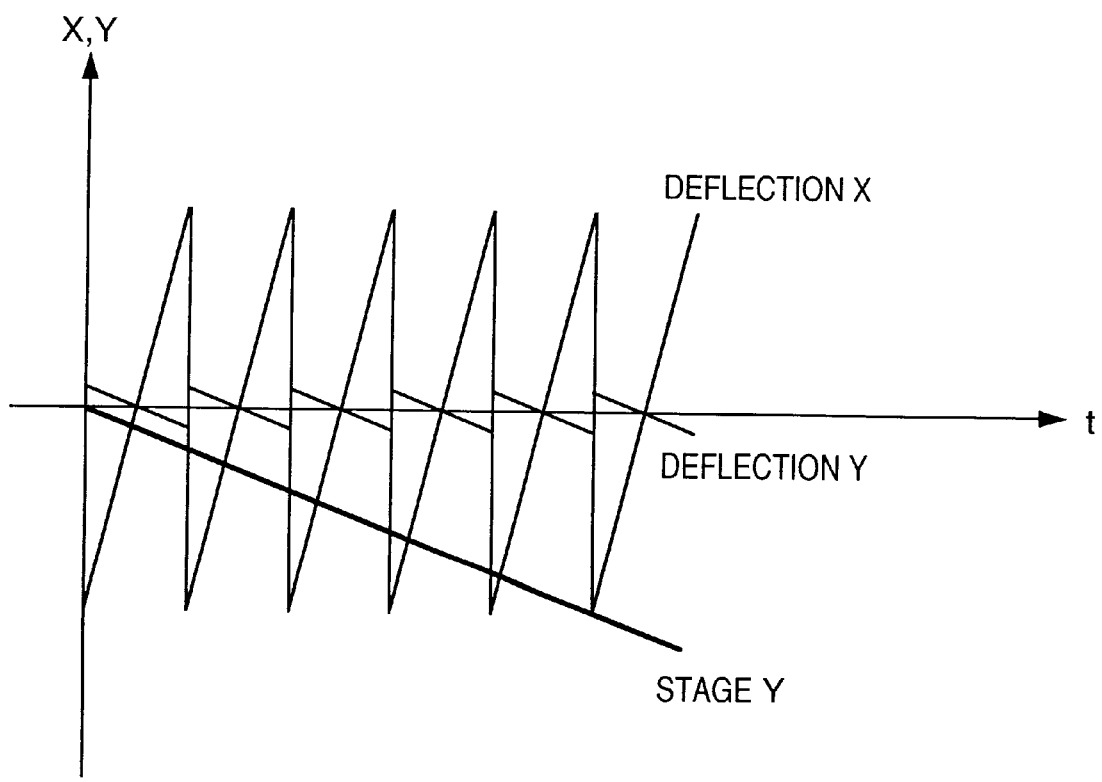
FIG. 6 is a timing chart showing a modification of the relationship between the main scan and subscan.

The present invention is not limited to the above embodiment, and various modifications may be made without departing from the scope of the invention. For example, in the above embodiment, the subscan is intermittently done in synchronism with the main scan. Alternatively, as shown in FIG. 6, the subscan synchronous with the main scan may be continuously done at constant speed. For example, if a 1 mm square exposure range is to be main-scanned, as described above, a subscan for 1 mm need only be done within the time required for this main scan. Furthermore, in the above embodiment, the subscan operation is controlled in synchronism with the main-scan operation. Alternatively, the main-scan operation may be controlled in synchronism with the subscan operation.

The above embodiment assumes that the mechanical movements of the stages 13 and 14 are done without any errors. However, in practice, movements inevitably produce errors. With these errors, the pattern to be exposed may suffer positional deviation. However, the deviation of the exposure position can be easily corrected by deflecting the electron beam. In this case, the positions of the ultraviolet mask 6 and wafer 1000 moved by the stages 13 and 14 are directly detected by the distance measuring devices 47 and 48, and the arithmetic circuit 46 calculates the deflection amount of the electron beam to be corrected on the basis of errors between the detected values and ideal values so as to control the operations of the axial moving coils 42 and 43 and axial deflectors 44 and 45 in correspondence with the arithmetic operation result, thereby electromagnetically correcting the deviation of the exposure position due to mechanical errors of the stages 13 and 14.

The above embodiment assumes that the electron beam to be irradiated onto the wafer 1000 has uniform intensity. However, the intensity of the electron beam is likely to be nonuniform due to the intensity distribution of ultraviolet rays that illuminate the ultraviolet mask 6, the efficiency distribution of electron emission of the photoelectric converter 9, and the like. For this reason, if such intensity nonuniformity poses a problem, preferably, the intensity distribution of the electron beam is measured upon, e.g., initialization, and is corrected during actual operation. In this case, an electron beam intensity detector 23 set beside the wafer stage 13 is moved to the exposure position to measure the electron beam intensity while executing axial movements and axial deflections. Based on the measurement result, the axial deflection and movement speeds may be increased in a region where the electron beam intensity is high to shorten the irradiation time of the electron beam, thereby making uniform the total amount of the electron beam to be irradiated onto the wafer 1000.

Figure 7:
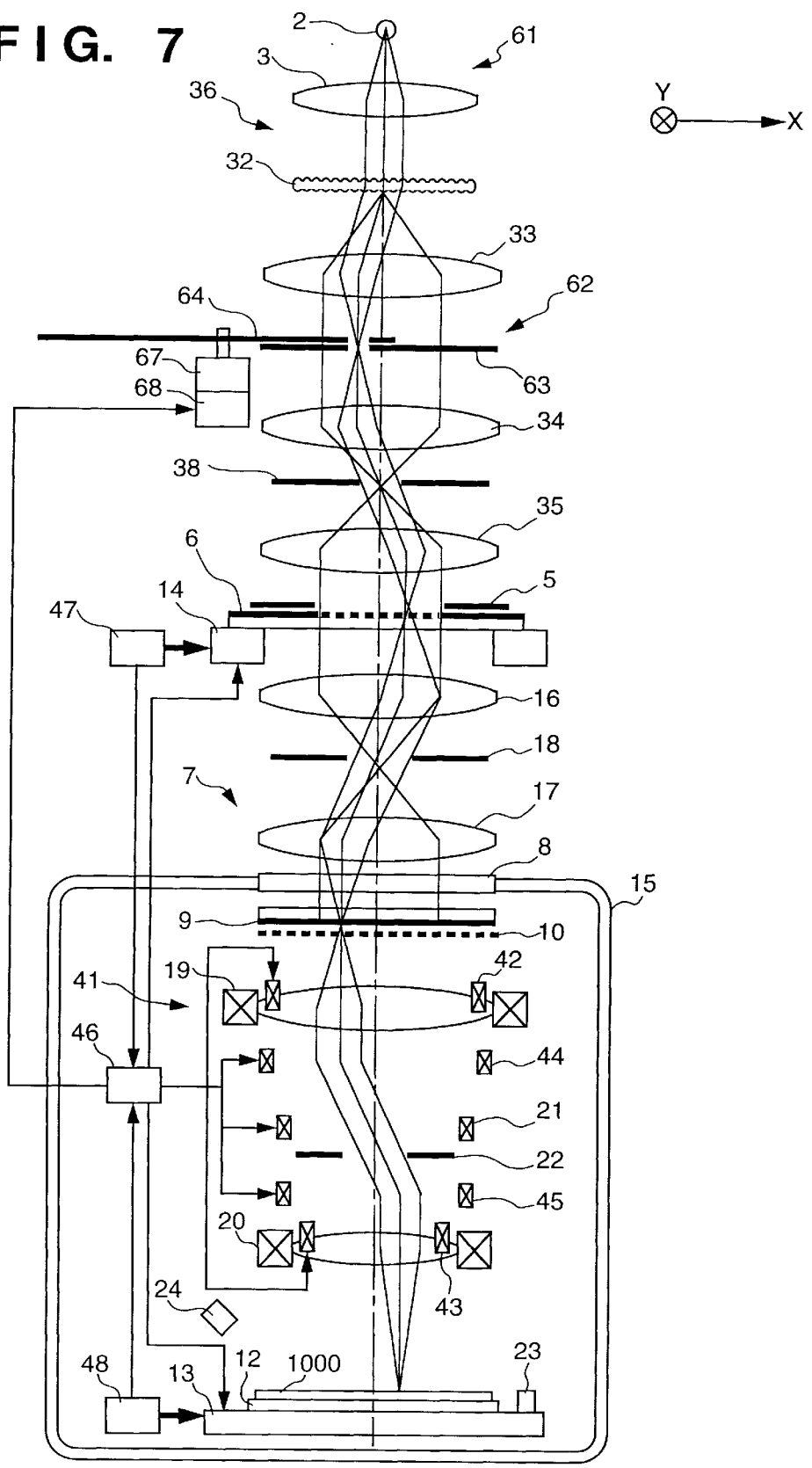
FIG. 7 is a front longitudinal sectional view showing the structure of an optical system of an electron beam exposure apparatus according to the second embodiment of the present invention.
Figure 8:
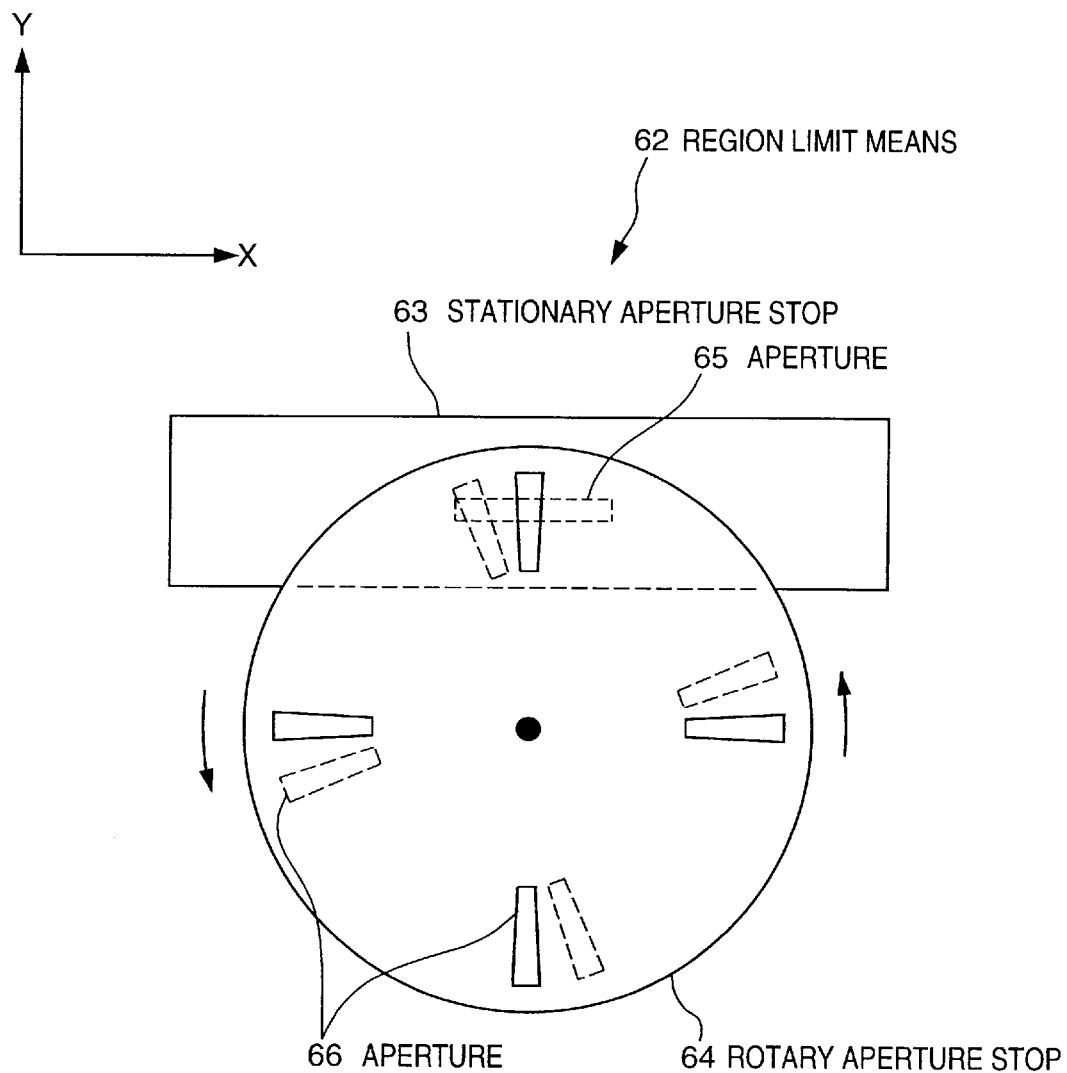
FIG. 8 is a plan view showing a portion of a region limit means.
Figure 9:
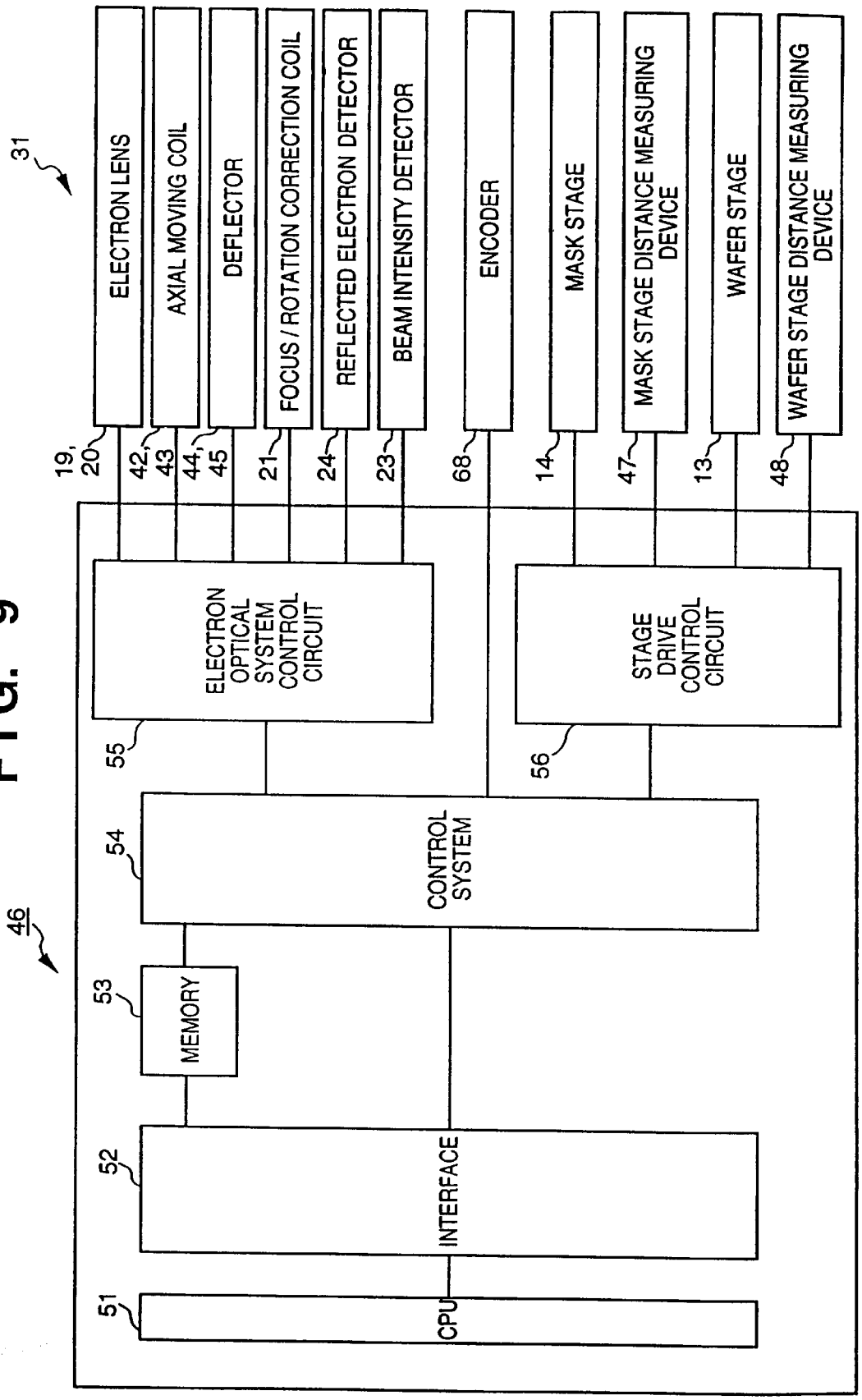
FIG. 9 is a block diagram showing the electrical structure of the electron beam exposure apparatus.

The second embodiment of the present invention will be described below with reference to FIGS. 7 to 9. Note that the same reference numerals in the second embodiment and the subsequent embodiments denote the same parts as in the above-mentioned first embodiment, and a detailed description thereof will be omitted. FIG. 7 is a front longitudinal sectional view showing the optical structure of an electron beam exposure apparatus according to this embodiment, FIG. 8 is a plan view showing a portion of a region limit means, and FIG. 9 is a block diagram showing the electrical structure of the electron beam exposure apparatus.

An electron beam exposure apparatus 61 of this embodiment comprises a region limit means 62 having a structure different from that in the above-mentioned electron beam exposure apparatus 31. As shown in FIGS. 7 and 8, the region limit means 62 comprises a stationary aperture stop 63 and rotary aperture stop 64. The stationary aperture stop 63 is formed with an aperture 65 in a slit shape elongated in the X-direction as the main scan direction. The rotary aperture stop 64 is formed with a plurality of fan-shaped slit-like apertures 66 in its radial direction, and these apertures overlap the aperture 65 on the stationary aperture stop 63.

The rotary aperture stop 64 is rotatably and axially supported by a drive motor 67 to which an encoder 68 is coupled. As shown in FIGS. 7 and 9, the encoder 68 is connected to an arithmetic circuit 46, which controls the main scan operations by axial moving coils 42 and 43 and axial deflectors 44 and 45 in correspondence with the rotational angle of the rotary aperture stop 64 detected by the encoder 68.

Note that FIG. 7 illustrates that the drive motor 67 is located in the X-direction with respect to the stationary aperture stop 63, for the sake of simplicity. However, in practice, as shown in FIG. 8, the center of the rotary aperture stop 64 as the position of the drive motor 67 is located in the Y-direction with respect to the stationary aperture stop 63.

In the above-mentioned arrangement, in the electron beam exposure apparatus 61 of this embodiment, ultraviolet rays to be incident on an ultraviolet mask 6 are main-scanned by the region limit means 62 which comprises the stationary aperture stop 63 and rotary aperture stop 64, and the axial movement and deflection of an electron beam are also controlled in synchronism with the rotation of the drive motor 67 of the region limit means 62.

In the electron beam exposure apparatus 61 of this embodiment, since the region limit means 62 that performs one and only one mechanical operation in the main scan of the exposure position is executed by the rotation of the rotary aperture stop 64 combined with the stationary aperture stop 63, this operation can be executed at high speed by a simple structure, thus further improving the productivity.

Figure 10:
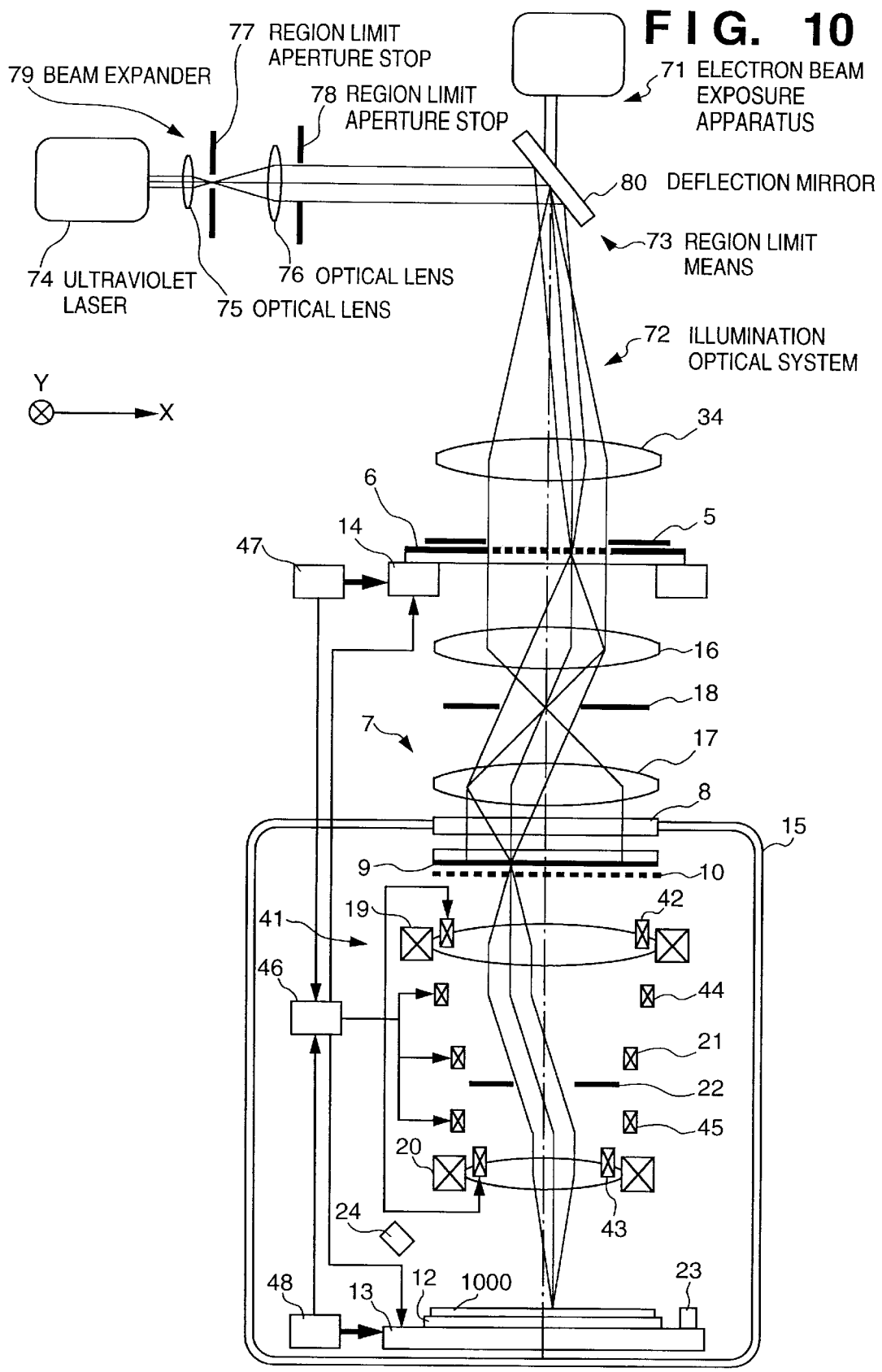
FIG. 10 is a front longitudinal sectional view showing the structure of an optical system of an electron beam exposure apparatus according to the third embodiment of the present invention.

The third embodiment of the present invention will be described below with reference to FIG. 10. FIG. 10 is a front longitudinal sectional view showing the optical structure of an electron beam exposure apparatus according to this embodiment.

An electron beam exposure apparatus 71 of this embodiment also has a region limit means 72 with a different structure, which is built in an ultraviolet illumination optical system 73. This ultraviolet illumination optical system 73 comprises an ultraviolet laser 74 as a light source, and optical lenses 75 and 76, and a beam expander 79 made up of region limit aperture stops 77 and 78, are disposed along the optical axis of the laser 74.

A deflection mirror 80 of the region limit means 72 is disposed on the optical path of the beam expander 79, and is swingably supported by a mirror drive mechanism 81. The swing direction of the mirror drive mechanism 81 is set to main-scan ultraviolet rays, reflected by the deflection mirror 80, in the X-direction. In this embodiment, the ultraviolet laser 74 and mirror drive mechanism 81 are connected to an arithmetic circuit 46, which controls lighting of the ultraviolet laser 74 and the operation of the mirror drive mechanism 81 in synchronism with the operations of axial moving coils 42 and 43 and axial deflectors 44 and 45.

In the above-mentioned arrangement, in the electron beam exposure apparatus 71 of this embodiment, since the mirror drive mechanism 81 vibrates the deflection mirror 80 at high speed in synchronism with lighting of the ultraviolet laser 74 to main-scan ultraviolet rays to be incident on an ultraviolet mask 6 in the X-direction, that operation can be done at high speed by a simple structure, thus further improving the productivity. Note that the deflection mirror 80 is vibrated to deflect and scan ultraviolet rays in this embodiment. Alternatively, a rotary polygonal mirror may replace the deflection mirror 80.

Figure 11:
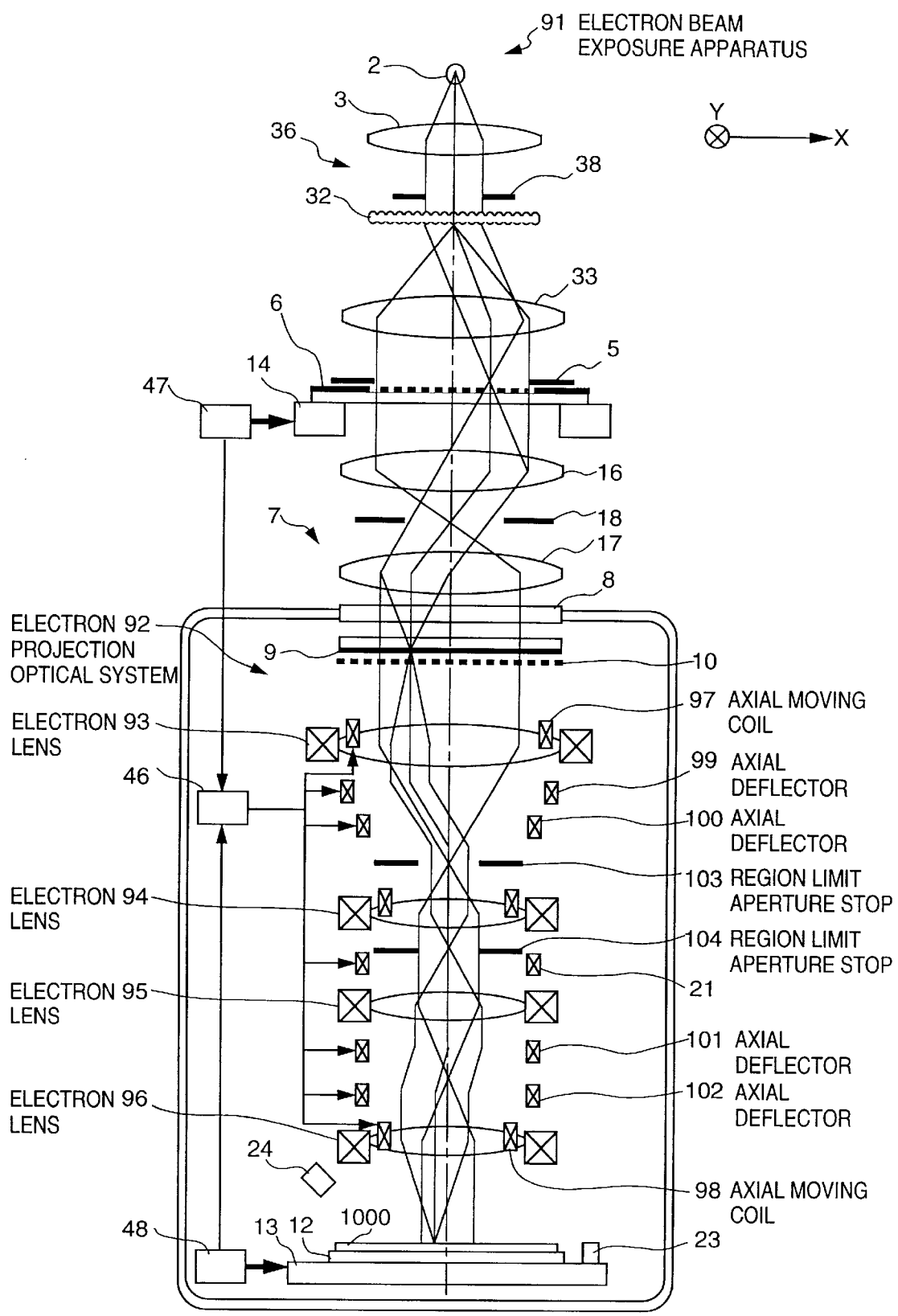
FIG. 11 is a front longitudinal sectional view showing the structure of an optical system of an electron beam exposure apparatus according to the second embodiment of the present invention.
Figure 12:
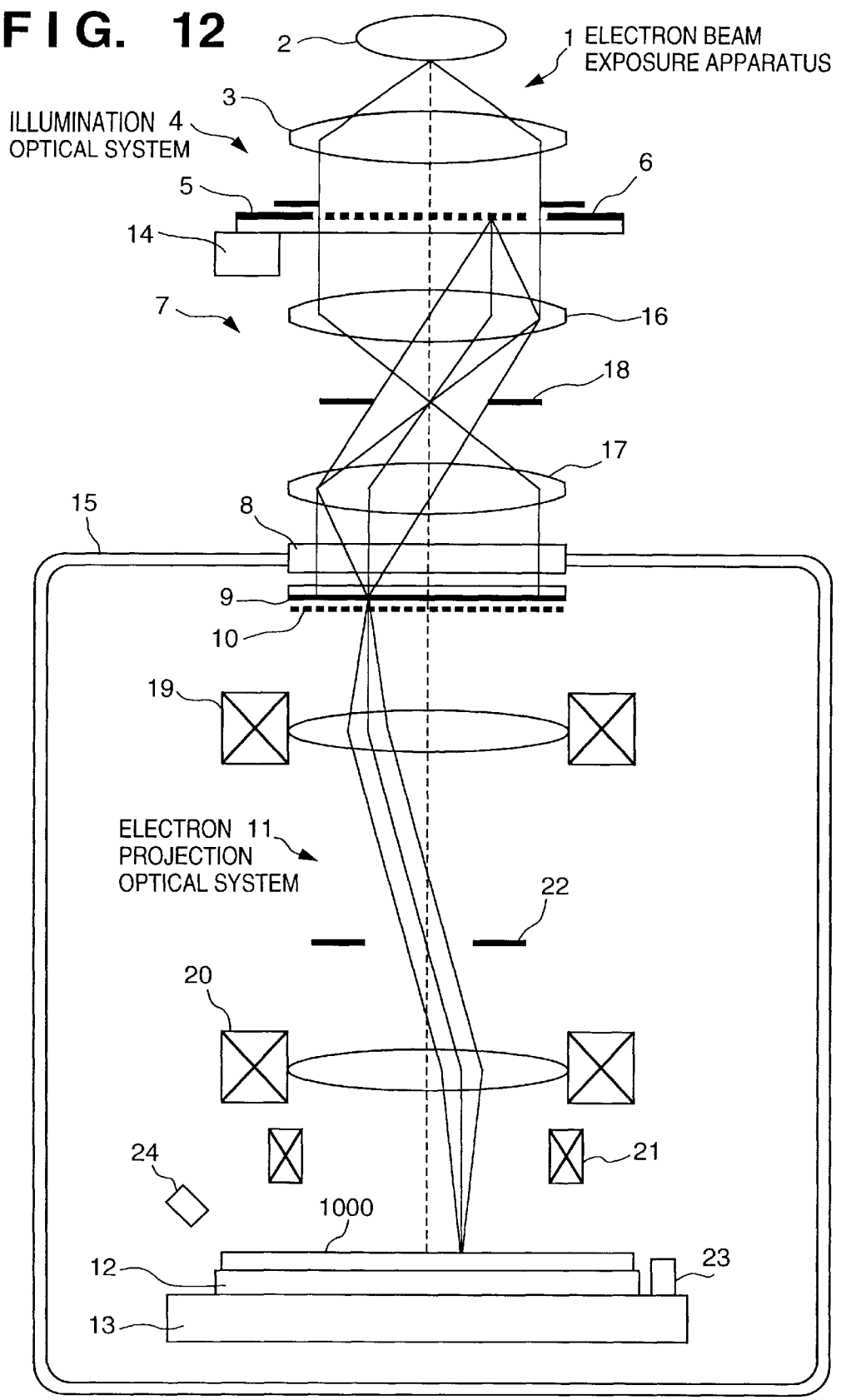
FIG. 12 is a front longitudinal sectional view showing the structure of an optical system of a conventional electron beam exposure apparatus.

The fourth embodiment of the present invention will be described below with reference to FIG. 11. FIG. 11 is a front longitudinal sectional view showing the optical structure of an electron beam exposure apparatus according to this embodiment.

An electron beam exposure apparatus 91 of this embodiment also has a region limit means with a different structure, which is integrally built in an electron projection optical system 92. The electron projection optical system 92 comprises four electron lenses 93 to 96, two axial moving coils 97 and 98, and four axial deflectors 99 to 102, and region limit aperture stops 103 and 104 are disposed in the path of an electron beam in that optical system. The electron lenses 93 to 96, axial moving coils 97 and 98, and axial deflectors 99 to 102 are connected to an arithmetic circuit 46, which controls an electron beam to always pass through the geometric center at the positions of the region limit aperture stops 103 and 104.

In the above-mentioned arrangement, in the electron beam exposure apparatus 91 of this embodiment, when axial movement and deflection of the electron beam are done by the electron projection optical system 92, the region of the electron beam is limited by making the electron beam pass through the positions of the region limit aperture stops 103 and 104 in a fixed path. For this reason, the exposure region can be limited without requiring any mechanical operations, and the productivity can be improved by executing exposure at higher speed.

An electron beam exposure apparatus according to one embodiment of the present invention comprises an illumination optical system (36) for outputting a light beam, a mask (6) for shaping the light beam coming from the illumination optical system (36) into a predetermined pattern, a mask stage (14) for supporting the mask (6) to be movable in a direction perpendicular to the optical axis, a photoelectric converter (9) for converting the light beam patterned by the mask (6) into an electron beam, a wafer stage (13) for supporting a wafer (1000) to be movable in a direction perpendicular to the optical axis of the electron beam, an electron projection optical system (41) for imaging the patterned electron beam emitted by the photoelectric converter (9) onto the surface of the wafer (1000), an axial shifter (42, 43) for shifting the optical center of the electron projection optical system (41) in a direction perpendicular to the optical axis, an axial deflector (44, 45) for deflecting the path of the electron beam in th e electron projection optical system (41), region limit means (38) for limiting the pattern of the mask (6) to be transferred onto the wafer (1000) by exposure to a partial region, main sc an control means (46) for main-scanning partially limited exposure regions of the mask (6) and wafer (1000) by synchronizing operations of the axial shifter (42, 43) and axial deflector (45, 46), and subscan control means (46) for sub-scanning the mask (6) and wafer (1000) by synchronizing operations of the mask stage (14) and wafer stage (13) to the operation of the main scan control means (46).

According to this exposure apparatus, since the partially limited exposure regions can be main-scanned and subscanned, and especially, the main scan is done electromagnetically and requires no mechanical operation, a broad range on the mask (6) can be transferred onto the wafer (1000) at high speed by exposure. In the electromagnetic main scan, since the optical center of the electron projection optical system (41) is shifted in correspondence with deflection of the path of the electron beam, the electron beam can be imaged with high precision, and exposure for a broad range can be accurately executed at high speed.

An electron beam exposure apparatus according to another embodiment of the present invention comprises an 38 illumination optical system (36) for outputting a light beam, a mask (6) for shaping the light beam coming from the illumination optical system (36) into a predetermined pattern, a mask stage (14) for supporting the mask (6) to be movable in a direction perpendicular to the optical axis, a photoelectric converter (9) for converting the patterned light beam into an electron beam, a wafer stage (13) for supporting a wafer (1000) to be movable in a direction perpendicular to the optical axis of the electron beam, an electron projection optical system (41) for imaging the patterned electron beam onto the surface of the wafer, an axial shifter (42, 43) for shifting the optical center of the electron projection optical system (41) in a direction perpendicular to the optical axis, an axial deflector (44, 45) for deflecting the path of the electron beam in the electron projection optical system (41), region limit means (38) for limiting the pattern of the mask (6) to be transferred onto the wafer (1000) by exposure to a partial region, subscan control means (46) for subscanning the mask (6) and wafer (1000) by synchronizing operations of the mask stage (14) and wafer stage (13), and main scan control means (46) for main-scanning partially limited exposure regions of the mask (6) and wafer (1000) by synchronizing operations of the axial shifter (42, 43) and axial deflector (44, 45) with the operation of the subscan control means (46).

According to this exposure apparatus, since the partially limited exposure regions can be main-scanned and subscanned, and especially, the main scan is done electromagnetically and requires no mechanical operation, a broad range on the mask (6) can be transferred onto the wafer (1000) at high speed by exposure. In the electromagnetic main scan, since the optical center of the electron projection optical system (41) is shifted in correspondence with deflection of the path of the electron beam, the electron beam can be imaged with high precision, and exposure for a broad range can be accurately executed at high speed.

In the above-mentioned electron beam exposure apparatus, the region limit means may comprise an aperture stop (37) which is supported in an incident optical path of the photoelectric converter to be movable in the direction perpendicular to the optical axis, and region scan means (39, 46) for main-scanning the aperture stop (37) in synchronism with the operation of the main scan control means (46). In this case, the exposure regions of the mask (6) and wafer (1000) can be main-scanned at high speed by a simple structure.

Furthermore, in the above-mentioned electron beam exposure apparatus, the region limit means may comprise an aperture stop (77, 78) for limiting a light beam coming from the illumination optical system, and deflection scan means (80, 81) for main-scanning the limited light beam in synchronism with the operation of the main scan control means (46). In this case, the exposure regions of the mask (6) and wafer (1000) can be main-scanned at high speed by a simple structure.

Moreover, in the above-mentioned electron beam exposure apparatus, the region limit means may comprise an aperture stop (103, 104) which is permanently disposed in a beam path of the electron projection optical system. In this case, the exposure regions of the mask (6) and wafer (1000) can be main-scanned at high speed by a simple structure without requiring any mechanical operation.

Also, the above-mentioned electron beam exposure apparatus may also comprise focus correction means (21) for moving the focal point position of the electron beam in the optical axis direction in correspondence with the operation of the main scan control means. In this case, since the focal point position that varies due to deflection and scan of the electron beam by the axial deflector and axial shifter can be corrected, exposure can be accurately done.

The present invention is not limited to the above embodiments and various changes and modifications can be made within the spirit and scope of the present invention. Therefore, to apprise the public of the scope of the present invention the following claims are made.

What is claimed is:

1. An electron beam exposure apparatus, which illuminates a mask with light emitted by a light source, photoelectrically converts the light patterned by said mask using a photoelectric converter, and exposes an object to be exposed with a patterned electron beam emitted by said photoelectric converter, said apparatus comprising:

an electron optical system for imaging the electron beam emitted by said photoelectric converter onto the object;

an axial shifter for shifting an optical center of said electron optical system in a direction perpendicular to an optical axis;

an axial deflector for deflecting the electron beam that propagates in said electron optical system;

region limit means for limiting a region of the mask to be projected onto the object via said photoelectric converter and said electron optical system to a partial region of the mask; and scan control means for scanning the object with the region-limited electron beam by changing the partial region to be limited while controlling said axial shifter and said axial deflector.

2. The apparatus according to claim 1, wherein said scan control means controls said axial shifter and said axial deflector to operate in synchronism with each other.

3. The apparatus according to claim 1, wherein said scan control means scans the region-limited electron beam in a main scan direction while controlling said axial shifter and said axial deflector, and said electron beam exposure apparatus further comprises second scan control means for controlling driving of at least one of a stage for supporting the mask and a stage for supporting the object so as to scan the object with the region-limited electron beam in a subscan direction.

4. The apparatus according to claim 1, wherein said region limit means comprises:

an aperture stop located between the light source and the mask; and an aperture drive unit for scanning said aperture stop in a direction agreeing with a direction to scan the electron beam by said axial shifter and said axial deflector, wherein said scan control means control said aperture drive unit to change the partial region defined by a position of said aperture stop.

5. The apparatus according to claim 1, wherein said region limit means comprises an aperture unit located between the light source and the mask, said aperture unit comprises:

a stationary aperture stop having a slit-like aperture elongated in a direction agreeing with a direction to scan the electron beam by said scan control means;

a rotary aperture stop having a slit-like aperture elongated in a radial direction thereof; and a drive unit for rotating said rotary aperture stop, and said rotary aperture stop is disposed at a position where a direction pointing from a center of said rotary aperture stop to the aperture of said stationary aperture stop is perpendicular to the direction to scan the electron beam by said scan control means, and said scan control means controls said drive unit to change the partial region defined by the apertures of said stationary stop and said rotary aperture stop.

6. The apparatus according to claim 1, wherein said region limit means comprises:

a mirror for reflecting light emitted by the light source and illuminating the mask with the reflected light;

an aperture stop inserted between the light source and said mirror; and a mirror drive unit for driving said mirror to scan the light reflected by said mirror in a direction agreeing with a direction to scan the electron beam by said axial shifter and said axial deflector, wherein said scan control means controls said mirror drive unit to change the partial region defined by an angle of said mirror.

7. The apparatus according to claim 1, wherein said region limit means comprises an aperture stop permanently disposed in said electron optical system and said scan control means controls said axial shifter and said axial deflector to change the partial region defined by statuses of said axial shifter and said axial deflector.

8. The apparatus according to claim 1, further comprising a focus adjustment unit for adjusting a focal point position of said electron optical system in synchronism with the control of said axial shifter and said axial deflector by said scan control means.

9. An electron beam exposure apparatus, which illuminates a mask with light emitted by a light source, photoelectrically converts the light patterned by the mask using a photoelectric converter, and exposes an object to be exposed with a patterned electron beam emitted by said photoelectric converter, said apparatus comprising:

an electron optical system for imaging the electron beam emitted by said photoelectric converter onto the object;

an axial shifter for shifting an optical center of said electron optical system in a direction perpendicular to an optical axis;

an axial deflector for deflecting the electron beam that propagates in said electron optical system;

region limit means for limiting a pattern on the mask to be projected onto the object to a partial region, wherein said region limit means comprises an aperture unit located between the light source and the mask; and scan control means for scanning the object with the region-limited electron beam while controlling said axial shifter and said axial deflector, wherein said aperture unit comprises:
a stationary aperture stop having a slit-like aperture elongated in a direction agreeing with a direction to scan the electron beam by said scan control means;
a rotary aperture stop having a slit-like aperture elongated in a radial direction thereof; and
a drive unit for rotating said rotary aperture stop, and said rotary aperture stop is disposed at a position where a direction pointing from a center of said rotary aperture stop to the aperture of said stationary aperture stop is perpendicular to the direction to scan the electron beam by said scan control means.

10. A method of manufacturing a device using an electron beam exposure apparatus, which illuminates a mask with light emitted by a light source, photoelectrically converts the light patterned by the mask using a photoelectric converter, and exposes a substrate on a substrate stage with a patterned electron beam emitted by the photoelectric converter, the electron beam exposure apparatus comprising:

an electron optical system for imaging the electron beam emitted by the photoelectric converter onto the substrate;

an axial shifter for shifting an optical center of the electron optical system in a direction perpendicular to an optical axis;

an axial deflector for deflecting the electron beam that propagates in the electron optical system;

region limit means for limiting a region of the mask to be projected onto the substrate via the photoelectric converter and electron optical system to a partial region of the mask; and scan control means for scanning the object with the region-limited electron beam by changing the partial region to be limited while controlling the axial shifter and the axial deflector, and said method comprising the steps of:
placing the substrate on the substrate stage; and
exposing the substrate on the substrate stage with the patterned electron beam in accordance with the pattern of the mask.

* * * * *

UNITED STATES PATENT AND TRADEMARK OFFICE
CERTIFICATE OF CORRECTION

PATENT NO. : 6,054,713

DATED : April 25, 2000

INVENTORS : AKIRA MIYAKE, ET AL.

It is certified that error appears in the above-identified patent and that said Letters Patent is hereby corrected as shown below:

ON THE COVER PAGE
Item [56], under "References Cited", "FOREIGN PATENT DOCUMENTS", "143326" should read --59-143326--.

IN THE DISCLOSURE:
COLUMN 14:
Line 17, "th e" should read --the--; and
Line 20, "sc an" should read --scan--.

Signed and Sealed this

Twenty-second Day of May, 2001

Attest:

NICHOLAS P. GODICI

*Attesting Officer*    Acting Director of the United States Patent and Trademark Office